(12) United States Patent
Feustel et al.

(10) Patent No.: US 7,462,563 B2
(45) Date of Patent: Dec. 9, 2008

(54) METHOD OF FORMING AN ETCH INDICATOR LAYER FOR REDUCING ETCH NON-UNIFORMITIES

(75) Inventors: Frank Feustel, Dresden (DE); Thomas Werner, Moritzburg (DE); Kai Frohberg, Niederau (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/688,280

(22) Filed: Mar. 20, 2007

(65) Prior Publication Data

US 2008/0026487 A1 Jan. 31, 2008

(30) Foreign Application Priority Data

Jul. 31, 2006 (DE) .................. 10 2006 035 668

(51) Int. Cl.
*H01L 21/311* (2006.01)
(52) U.S. Cl. .................. 438/700; 438/638; 438/673; 438/42
(58) Field of Classification Search ......... 438/672–673, 438/637–638, 618–624, 42
See application file for complete search history.

(56) References Cited

U.S. PATENT DOCUMENTS

| 5,937,301 | A | 8/1999 | Gardner et al. ............. 438/303 |
| 7,005,305 | B2 | 2/2006 | Grasshoff et al. ............. 438/9 |
| 2003/0211738 | A1* | 11/2003 | Nagata .................. 438/689 |
| 2004/0127016 | A1* | 7/2004 | Hoog et al. ............... 438/637 |
| 2004/0229426 | A1* | 11/2004 | Lee et al. ................ 438/248 |
| 2006/0249479 | A1* | 11/2006 | Okubo et al. .............. 216/59 |

FOREIGN PATENT DOCUMENTS

EP 0 304 729 B1 3/1993

* cited by examiner

*Primary Examiner*—Dung A. Le
(74) *Attorney, Agent, or Firm*—Williams, Morgan & Amerson, P.C.

(57) ABSTRACT

By incorporating an etch control material after the formation of a material layer to be patterned, an appropriate material having a highly distinctive radiation wavelength may be used for generating a distinctive endpoint detection signal during an etch process. Advantageously, the material may be incorporated by ion implantation which provides reduced non-uniformity compared to etch non-uniformities, while the implantation process provides the potential for introducing even very "exotic" implantation species. In some embodiments, the substrate-to-substrate uniformity of the patterning of dual damascene structures may be increased.

23 Claims, 8 Drawing Sheets

METHOD OF FORMING AN ETCH INDICATOR LAYER FOR REDUCING ETCH NON-UNIFORMITIES

BACKGROUND OF THE INVENTION

1. Field of the Invention

Generally, the subject matter disclosed herein relates to the manufacturing of integrated circuits, and, more particularly, to advanced etch processes for patterning substantially homogeneous materials to a target depth, such as advanced trench etch processes in the dual in-laid technique and the like.

2. Description of the Related Art

In modern integrated circuits, minimum feature sizes, such as the channel length of field effect transistors, have reached the deep sub-micron range, thereby steadily increasing performance of these circuits in terms of speed and power consumption. As the size of the individual circuit elements is significantly reduced, thereby improving, for example, the switching speed of transistor elements, the available floor space for the various components, such as drain and source regions, gate electrodes of transistors and interconnect lines electrically connecting the individual circuit elements, is also decreased. Consequently, the dimensions of these components have to be reduced to compensate for a reduced amount of available floor space and for an increased number of circuit elements provided per chip. One prominent example in this respect are metal lines and vias provided in the wiring levels of integrated circuits. In integrated circuits having minimum dimensions of approximately 0.35 μm and less, a limiting factor of device performance is the signal propagation delay caused by the switching speed of the involved transistor elements. As the channel length of these elements has reached 0.18 μm and less, it turns out, however, that the signal propagation delay is no longer limited by the field effect transistors but is limited, owing to the increased circuit density, by the close proximity of the metal lines in the wiring levels, since the line-to-line capacitance is increased in combination with a reduced conductivity of the lines due to a reduced cross-sectional area. The parasitic RC (resistance/capacitance) time constants therefore may require the introduction of a new type of dielectric material, preferably in combination with a highly conductive metal.

Traditionally, metallization layers are formed by a dielectric layer stack including, for example, silicon dioxide and/or silicon nitride, with aluminum as the typical metal. Since aluminum exhibits significant electromigration at higher current densities, in highly sophisticated integrated circuits, aluminum is commonly replaced by copper, having a significantly lower electrical resistance and a higher resistivity against electromigration. Moreover, the well-established and well-known dielectric materials silicon dioxide (k≈4.2) and silicon nitride (k>5) are increasingly replaced by low-k materials to reduce the parasitic capacitance. However, the transition from the well-known and well-established aluminum/silicon dioxide metallization layer to a low-k dielectric/copper metallization layer is associated with a plurality of issues to be dealt with.

For example, copper may not be deposited in higher amounts in an efficient manner by well-established deposition methods, such as chemical and physical vapor deposition. Moreover, copper may not be efficiently patterned by well-established anisotropic etch processes. Consequently the so-called in-laid or damascene technique is employed in forming metallization layers including copper-containing lines. Typically, in the damascene technique, the dielectric layer is deposited and then patterned with trenches and vias that are subsequently filled with a metal by plating methods, such as electroplating or electroless plating. For forming vias providing electrical connection from an overlying metal line to an underlying metal line of a lower metallization layer, the vias and the trenches may be filled in a single process so that the via and the trench have to be patterned prior to filling in the copper. A corresponding technique, also referred to as dual damascene technique, is carried out for a conventional dielectric layer stack by providing a silicon dioxide layer and an intermediate silicon nitride layer that acts as an etch stop layer for the trench etch and a second silicon dioxide layer formed thereon. Prior to or after the trench etch process, a via may be etched in the lower silicon layer, depending on the specific process strategy. In any case, the trench etch process may be reliably controlled on the basis of the intermediate etch stop layer.

When replacing the high-k material silicon dioxide by a low-k material, the situation in forming the via and trench is quite different, as the provision of an intermediate etch stop layer, such as the silicon nitride layer exhibiting a high k value, may unduly increase the permittivity of the entire dielectric layer stack. To obtain a minimum permittivity, the intermediate etch stop layer is commonly omitted. Consequently, the trench etch process may not be stopped by an intermediate etch stop layer, as typically materials having a high etch selectivity with respect to the low-k dielectric under consideration may not provide the desired low permittivity characteristics.

Figure 1A:
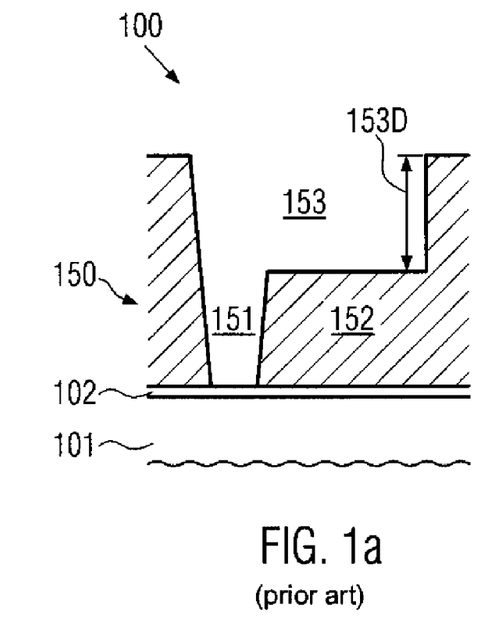
FIGS. 1a-1c schematically illustrate cross-sectional views of a semiconductor device having formed therein respective vias and trenches of a metallization layer, which are formed according to a conventional process technique in a dual damascene regime.
Figure 1B:
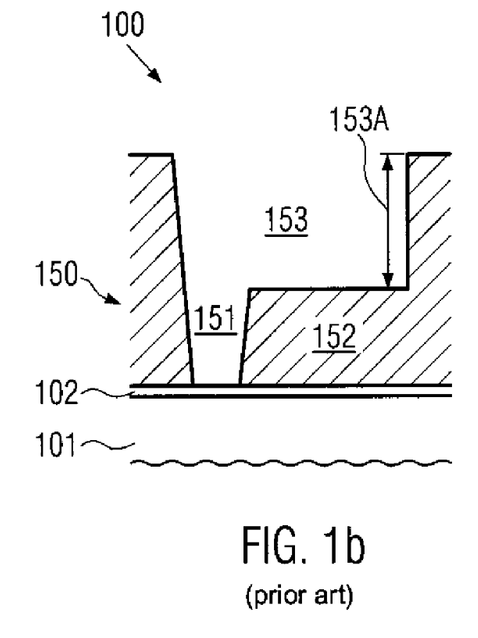
Figure 1C:
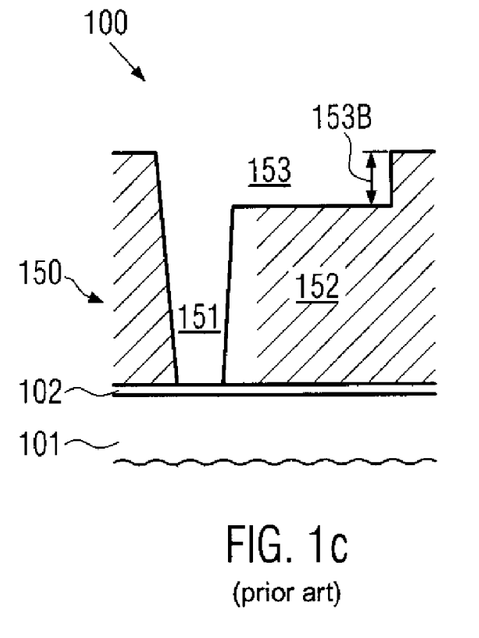

With reference to FIGS. 1a-1c, the situation of a trench etch process performed in a substantially homogeneous dielectric layer will be described in more detail. FIG. 1a schematically illustrates cross-sectional views of a semiconductor device 100 comprising a metallization layer 150 after the trench etch process. The semiconductor device 100 may comprise a substrate 101 in and over which may be provided circuit elements (not shown), such as transistors and the like, which are electrically connected by one or more of the metallization layers 150. The substrate 101 may further comprise an etch stop layer 102, which may be formed of any appropriate material that exhibits desired characteristics with respect to covering any buried regions, such as metal regions and the like, and to serve as an etch stop layer during a via etch process for forming a via 151 in a dielectric material layer 152 of the metallization layer 150. The dielectric layer 152 may be provided, at least over an extended height, as a substantially homogeneous material, such as a low-k material, in order to obtain a low overall permittivity. Furthermore, a trench 153 is formed in an upper portion of the layer 152, wherein the trench 153 may have a depth 153D that, in combination with the respective trench width, is an important factor for determining the characteristics of the metallization layer 150 with respect to reliability. That is, the conductivity, the electromigration behavior and the like may be influenced by the thickness of the respective metal lines formed from the trench 153. Thus, the depth 153D may represent an important design measure for adjusting the operational behavior of the semiconductor device 100.

A typical process flow for forming the device 100 as shown in FIG. 1a may comprise the following processes. After any circuit elements have been formed in and above the substrate 101, the etch stop layer 102 may be deposited by any appropriate deposition technique, such as chemical vapor deposition (CVD), spin-on techniques and the like. Thereafter, the dielectric layer 152 may be formed using any manufacturing technique as appropriate in view of material and process requirements. Next, an etch process may be performed, wherein, depending on the process requirements, the via 151 may be formed first on the basis of an appropriate patterning regime. Subsequently, the trench 153 may be formed, wherein the surface topography may be suitably planarized prior to performing a corresponding patterning process for forming an etch mask for the trench 153. Thereafter, an etch process is performed on the basis of a specified set of process parameters. Due to the homogeneous nature of the layer 152, the depth 153D may be controlled by adjusting the etch time.

As is well-known, in complex manufacturing environments, a plurality of etch chambers may be used for the various etch processes, wherein process fluctuations may occur, which may, however, directly translate into respective depth fluctuations during the trench etch process. Moreover, even within a single etch chamber, the etch rate may vary slightly, even if the respective process parameters are maintained at their target values. Consequently, an unwanted depth fluctuation may be observed between substrates or lots of substrates after the trench etch process.

FIG. 1b schematically illustrates the device 100 formed on a different substrate, wherein the respective trench 153 has a depth 153A that is greater than the target value 153D. FIG. 1c schematically shows the device 100 formed above yet another substrate. In this case, the respective trench 153 may have a depth 153B that is less than the target value 153D.

Consequently, the devices 100 according to FIG. 1a-1c at least may have a significantly differing operational behavior, wherein a certain degree of fluctuation may even result in faulty devices.

It has therefore been proposed to introduce a material into the layer 152, which may have different characteristics during an optical endpoint detection, while not unduly affecting the overall permittivity of layer 152. Since a corresponding intermediate layer may be deposited during the formation of the layer 152 with a reduced degree of process non-uniformity compared to the etch fluctuations described above, thereby allowing, in principle, an enhanced detectability of the end of the trench etch process, the high degree of similarity of the etch indicator material compared to the actual material of the layer 152, required for maintaining the overall permittivity at a low level, may raise significant difficulties in detecting the intermediate etch indicator layer when the etch front releases respective atomic species into the etch ambient. Thus, the resulting optical endpoint signal may not be reliable.

In view of the situation described above, there exists a need for a technique that enables the formation of trenches in materials in a more reliable manner, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique for patterning material layers during the formation of microstructure devices, such as integrated circuits and the like, wherein the patterning process may be controlled in a more reliable manner by incorporating an appropriate etch control material, i.e., a material that may provide a reliable endpoint detection signal and/or provide a reduced etch rate, into the respective material layer after the formation thereof. The incorporation of the respective etch control material after forming the material layer under consideration may provide enhanced process flexibility and controllability, since the composition of the etch control material may be selected on the basis of detectability in a subsequent etch process rather than in view of compatibility with the manufacturing process for forming the material layer under consideration. In one aspect, an implantation process may be used for introducing an appropriate etch control material into the material layer under consideration at a specified depth, wherein the degree of influence on the remaining material layer may be maintained at a low level by, for instance, incorporating the etch control material in a laterally restricted area of the material layer and/or by incorporating a small concentration, which may nevertheless provide a prominent endpoint detection signal, since extremely distinctive species may be incorporated by the implantation process. Furthermore, the implantation process per se may exhibit an increased process uniformity with respect to substrate-to-substrate uniformity compared to typical fluctuations of etch processes so that the respective etch control material may be positioned with a significantly reduced degree of substrate-to-substrate non-uniformity compared to etch processes, thereby providing the potential for increasing the overall process uniformity. In other aspects, an appropriate etch control material may be incorporated at specified positions, for instance at via openings, in order to release the respective etch control material in a subsequent patterning process when forming respective openings or trenches around the via opening. Since a corresponding material deposition process may also be performed with a reduced substrate-to-substrate non-uniformity, in total an increased controllability of the resulting etch process may be achieved.

According to one illustrative embodiment disclosed herein, a method comprises implanting a specified etch control material into a material layer of a microstructure device to specify a target depth in the material layer. Thereafter, the material layer is patterned by performing an etch process and the etch process is controlled on the basis of the implanted etch control material.

According to another illustrative embodiment disclosed herein, a method comprises forming a material layer above a substrate of a microstructure device and forming an etch control material within a laterally restricted area of the material layer in order to specify a predetermined target depth in the material layer. Furthermore, the method comprises performing an etch process for patterning the material layer while using the etch control material for controlling the etch process.

BRIEF DESCRIPTION OF THE DRAWINGS

The disclosure may be understood by reference to the following description taken in conjunction with the accompanying drawings, in which like reference numerals identify like elements, and in which:

FIG. 2b schematically illustrates a concentration distribution of the etch control material formed within the dielectric layer of the device as shown in FIG. 2a;

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to the patterning of material layers required during the manufacturing sequence for forming microstructures, such as integrated circuits and the like. In some manufacturing stages for advanced microstructures, it may be necessary to etch material layers, such as dielectric layers, semiconductor layers, metal layers and the like, wherein the corresponding etch process has to be stopped within the material layer at a specified target depth. As previously explained, complex etch processes depend on a plurality of process parameters and other ambient conditions, such as the status of the process chamber and the like, so that different etch rates may be encountered even if the process parameters, such as plasma power, flow rates of reactive gases and carrier gases, pressure, substrate temperature and the like, are maintained within precisely defined process margins. Consequently, during the processing of a plurality of substrates, respective depth fluctuations may occur which may negatively influence the further processing of the device and/or the operational behavior thereof, as is previously explained. In many cases, the provision of an intermediate etch stop layer may not be tolerable due to a significant interaction with the remaining material of the layer under consideration, for instance with respect to a significant increase of the relative permittivity thereof. However, providing a similar material, which may potentially be detected during the etch process on the basis of any released species, may suffer from a non-reliable detectability, or may also cause a significant alteration of the overall material characteristics, since a significant concentration may be required. Consequently, according to the present disclosure, a technique is contemplated in which an efficient etch control material may be incorporated after forming the material layer under consideration, wherein a low degree of influence on the overall material characteristics may be maintained, while nevertheless an efficient control of the etch process may be accomplished, while a high degree of compatibility with a well-established process flow may also be maintained, for instance with respect to avoiding additional photolithography steps and the like.

In some illustrative embodiments, a low degree of impact on the material characteristics of the layer to be patterned may be achieved by using an implantation process for incorporating an appropriate implantation species, which may provide a high distinctive endpoint detection signal and/or which may even provide a certain degree of etch stop characteristics. For this purpose, in some illustrative embodiments, a respective implantation species may be incorporated into the material layer under consideration at a moderately low concentration so as to maintain the influence on the overall material characteristics at a desired low level. In other cases, the respective implantation species may be incorporated in a laterally restricted manner, for instance on the basis of an etch mask to be used for patterning the material layer under consideration, thereby allowing the incorporation of increased concentrations and providing enhanced reliability in the creation of a respective endpoint detection signal and/or enabling a locally restricted material modification so as to appropriately change the etch characteristics at a respective predetermined depth. In other cases, an appropriate etch control material may be incorporated in the material layer under consideration at an intermediate manufacturing stage during the patterning of the material layer, wherein the process of incorporating the corresponding etch control material may be based on highly controllable process parameters with a reduced degree of process variation from substrate to substrate compared to etch-related non-uniformities, as are previously discussed.

It should be appreciated that the subject matter disclosed herein is highly advantageous in the context of patterning dielectric materials, such as low-k dielectric materials, in metallization layers of advanced semiconductor devices, since here trenches may have to be formed on the basis of a substantially homogeneous dielectric material, the characteristics of which may not be significantly altered in view of the operational behavior of the respective metal lines and vias. The principles of the present invention may, however, also be applied to other situations in which an opening has to be formed in respective material layers down to a specified target depth, wherein the previous formation of an etch stop layer may not be compatible with the process flow and/or the material characteristics. For instance, in advanced field effect transistors, frequently a strained semiconductor material may be incorporated into respective transistor areas, such as the drain and source regions, in order to provide a desired high strain in the channel region of the device. For this purpose, in some frequently used approaches, a corresponding recess is formed in the active region, wherein the depth and the size of the recess may substantially determine, in combination with the type of material epitaxially grown in the corresponding recesses, the finally obtained strain in the channel region. Since conventionally the etch process for forming the recesses may not be controlled by an etch stop layer, substrate-to-substrate uniformity of the corresponding etch process may rely on the uniformity of the etch process and may therefore be subject to corresponding fluctuations, as previously explained. Also, in this case, a respective etch control material may be efficiently used for increasing the controllability and thus uniformity of the corresponding cavity etch process. Consequently, unless specifically set forth in the specification and the appended claims, the present invention should not be construed as being restricted to the patterning of dielectric layers of metallization levels in advanced semiconductor devices.

Figure 2A:
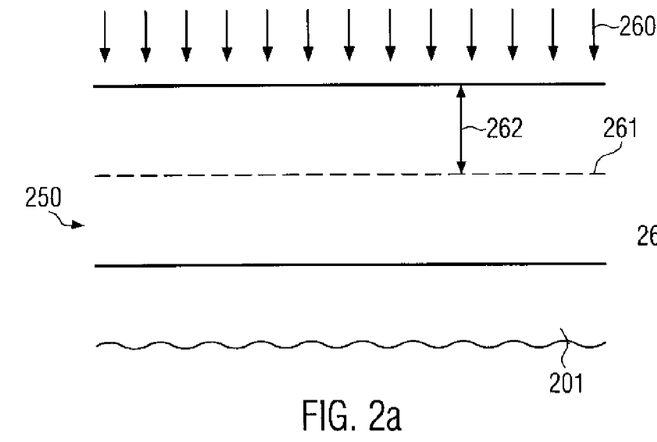
FIG. 2a schematically illustrates a cross-sectional view of a microstructure device receiving an etch control material in a previously formed dielectric layer in accordance with illustrative embodiments disclosed herein.

FIG. 2a schematically illustrates a cross-sectional view of a microstructure device 200, which, in one illustrative embodiment, may represent an advanced semiconductor device including a plurality of circuit elements (not shown) having critical dimensions of 100 nm and significantly less, or even 50 nm and less. The device 200 may comprise a substrate 201, which may represent any appropriate carrier material for forming thereon and therein respective features, such as circuit elements, micromechanical devices, opto-electronic devices and the like. For convenience, any such components are not shown in FIG. 2a. In some illustrative embodiments, the substrate 201 may represent the substrate for an advanced semiconductor device and may therefore represent a silicon-based material, a silicon-on-insulator (SOI) substrate and the like. The device 200 may further comprise a material layer 250 formed above the substrate 201, which may have to be patterned in accordance with process and device requirements. In one illustrative embodiment, the material layer 250 may represent, in this manufacturing stage, the dielectric material of a metallization layer of an advanced semiconductor device. In this case, the material layer 250 may be comprised of any appropriate dielectric material, wherein, in sophisticated applications, the material characteristics may be substantially homogeneously provided across a significant portion of the entire thickness of the material layer 250. It should be appreciated that the material layer 250 may represent a layer stack including additional components, such as an etch stop layer, a capping layer and the like, as required for the further processing and for adjusting device characteristics. For convenience, any such additional layers are not shown in FIG. 2a. It should be appreciated, however, that at least a significant portion of the material layer 250 may have substantially homogeneous characteristics, at least at a target depth range to which an opening is to be formed in the material layer 250 in a subsequent patterning process.

The microstructure device 200 as shown in FIG. 2a may be formed on the basis of any appropriate process technique, as is also, for instance, described with reference to the semiconductor device 100, when the material layer 250 is to represent a metallization layer. In other cases, any other appropriate process techniques may be employed for forming respective microstructure components in and above the substrate 201, followed by any appropriate deposition technique for forming the material layer 250, which may include different types of deposition techniques, such as chemical vapor deposition (CVD), physical vapor deposition (PVD), electroless plating, electroplating, combinations thereof and the like. Moreover, sophisticated planarization techniques may also be used for forming the material layer 250, if required. Thereafter, according to one illustrative embodiment, an implantation process 260 may be performed in order to introduce an appropriate implantation species 261 at a specific depth 262 of the layer 250. In one illustrative embodiment, the implantation process 260 may be performed on the basis of process parameters, such as implantation dose, so as to create a moderately low concentration at the desired depth 262 in order to maintain any interaction of the implantation species 261 during and after the implantation process 260 with the material of the layer 250 at a low level. For instance, a moderately low implantation dose of approximately $10^{11}$-$10^{15}$ ions/cm$^2$ may be used in combination with an appropriate implantation energy in order to position the respective implantation species 261 at the desired depth 262.

It is well known that a large number of species may be processed in available implantation tools, for instance on the basis of appropriate precursor materials, such as gaseous components, which may be appropriately ionized and accelerated to form an appropriate ion beam with relatively high uniformity. For instance, the implantation energy may be controlled with high precision on the basis of beam optics including magnets and the like so that the associated average penetration depth may be adjusted with high uniformity for a plurality of substrates, as long as the material characteristics of the layer 250 for the plurality of substrates are within respective process tolerances. In this respect, it should be appreciated that, for instance, a substrate-to-substrate fluctuation in layer thickness of the material layer 250 may be less critical compared to etch non-uniformities, since the corresponding penetration depth may not be substantially affected. That is, the averaged penetration depth 262 for the implantation species 261 under consideration may remain substantially the same so that a corresponding depth of a respective trench formed on the basis of the species 261 may remain substantially unchanged. Consequently, due to the reduced substrate-to-substrate non-uniformity of the implantation process 260, the implantation species 261 may be positioned at the predetermined depth 262 with a corresponding high uniformity for a plurality of substrates, thereby providing an efficient means for obtaining a reliable control information for a subsequent etch process. Due to the availability of a wide class of implantation species, suitable materials may be selected which provide a highly distinctive endpoint detection signal during a subsequent etch process. Thus, "exotic" candidates may be selected, which may provide a well-detectable signal, even if provided with a low concentration. In this way, the overall material characteristics of the layer 250 may be substantially maintained, while nevertheless a high degree of controllability may be achieved. For example, appropriate atomic species providing a well-detectable, that is, distinctive emission wavelength when ionized in a plasma ambient of an etch atmosphere may be selected as the implantation species 261. In this way, a corresponding optical endpoint detection system may be adjusted to the corresponding emission wavelength without significant noise or interference from other components that are also released or present during the respective etch process.

Figure 2B:
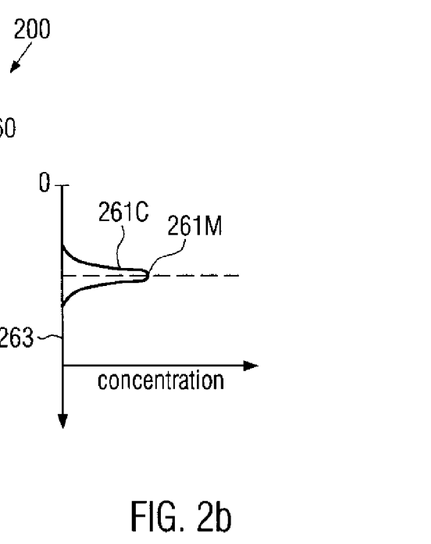

FIG. 2b schematically illustrates a typical distribution of the concentration of the implantation species 261, indicated as curve 261C, with respect to the depth direction, indicated as 263, of the material layer 250. As is schematically illustrated in FIG. 2b, a respective maximum 261M of the curve 261C may be located at a desired depth, in this case the depth 262, wherein, in some illustrative embodiments, the desired depth 262 may represent a target depth of an opening to be formed in the layer 250. It should be appreciated, however, that the depth 262 may not actually represent the target depth of a trench or an opening but may provide an indication thereof. For instance, upon detecting any appropriate point of the distribution 261C shown in FIG. 2b, for instance the maximum value 261M, the corresponding etch process may not necessarily be stopped but may be continued for a defined time period if required. Moreover, as indicated in FIG. 2b, the distribution 261C of the implantation species 261 may be centered around the desired depth 262, wherein the "width" of the corresponding distribution 261C may depend on the material characteristics of the layer 250, the implantation species to be incorporated, the desired depth 262 and the like. Although a reduced width of the distribution may be desirable with respect to control efficiency and reduced interaction with the material of the layer 250, a more or less increased width of the implantation profile may nevertheless allow a precise detection of a respective endpoint detection signal as long as the pronounced maximum 261M may be provided, since then the point of the maximum intensity of the respective endpoint detection signal may be used as the actual control information of the implantation profile as shown in FIG. 2b.

Figure 2C:
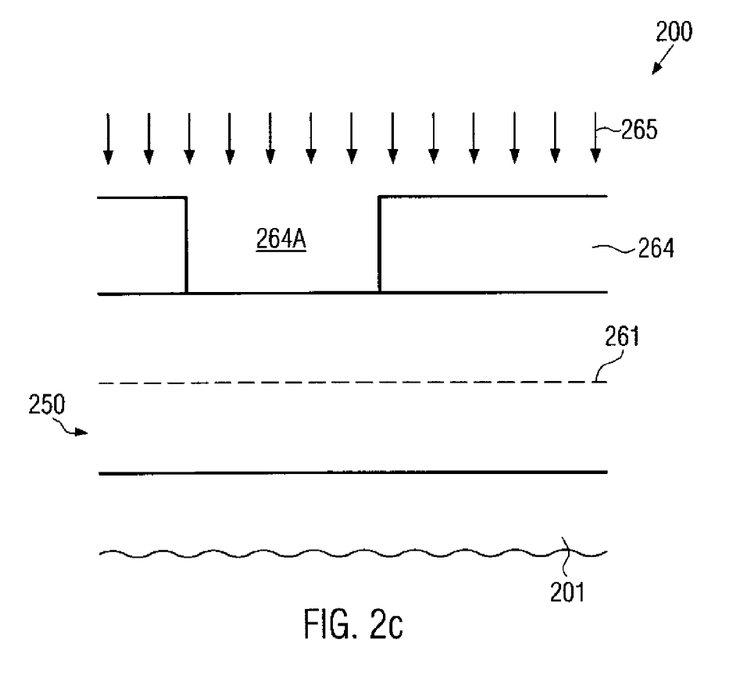
FIGS. 2c-2d schematically illustrate cross-sectional views of the microstructure of FIG. 2a in further advanced manufacturing stages.

FIG. 2c schematically illustrates the microstructure device 200 in a further advanced manufacturing stage, wherein an etch mask 264 is formed above the material layer 250, which may define the lateral borders of an opening to be formed in the material layer 250 to a desired target depth, such as the depth 262, if an etch process 265 is to be substantially stopped at the maximum concentration 261M as shown in FIG. 2b. The etch mask 264 may be provided in the form of any appropriate material, such as a resist material, a hard mask or any combination thereof, wherein the mask 264 may also comprise an appropriate antireflective coating (ARC) material, if required, for patterning the mask 264 by advanced lithography techniques.

Figure 2D:
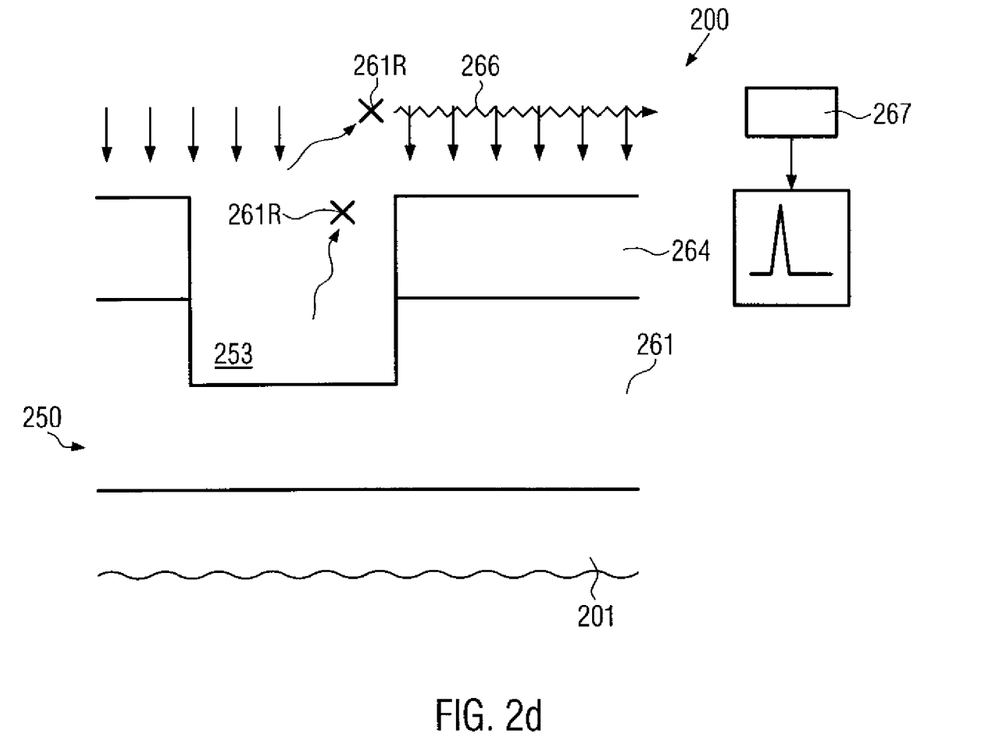

FIG. 2d schematically illustrates the microstructure device 200 in a further advanced stage of the etch process 265, wherein an opening 253 is formed in the upper portion of the layer 250, wherein the etch front may already contact the implantation species, thereby increasingly releasing respective atomic or molecular species 261R, which may lead to a corresponding emission of radiation 266, which in turn may be detected by a corresponding optical endpoint detection system 267. The system 267 may be adapted to determine a maximum intensity of the corresponding radiation 266, i.e., of a specified wavelength range, in order to give a reliable indication for controlling the etch process 265. For instance, as previously explained, upon detecting a maximum intensity of the radiation 266, the etch process 265 may be stopped or may be continued for a predefined short time period. Thus, even if a different etch rate may occur during the etch process 265 in different substrates due to substrate-to-substrate fluctuations, such etch process related non-uniformities may be significantly reduced due to the provision of the implantation species 261, since the implantation process 260 (FIG. 2a) may have per se an increased substrate-to-substrate uniformity, while the corresponding endpoint detection signal, for instance provided by radiation 266, may be detected and evaluated with high precision, even if moderately low concentrations are incorporated so as to reduce any negative impact of the implantation species 261 on the material layer 250. Moreover, since moderately low implant concentrations are sufficient for efficiently controlling the etch process 265, implantation-induced damage of the material layer 250, which may possibly change the material characteristics of the upper portion of the layer 250, may be maintained at a very low level.

In some illustrative embodiments, the ion bombardment during the implantation process 260 may be intentionally raised to a specified level in order to positively change the material characteristics, for instance with respect to increasing the porosity and thus reducing the permittivity, enhancing the out-gassing behavior and the like. For instance, the implantation process 260 may be performed prior to performing a respective heat treatment in order to remove unwanted components from the layer 250 by exposing the device 200 to a vacuum ambient at elevated temperatures for removing any nitrogen radicals and the like, for reducing resist poisoning effects and the like. In other cases, a moderately high ion bombardment may reduce the relative permittivity due to the formation of micro cracks, and the like.

Consequently, the incorporation of the implant species 261 may provide enhanced controllability of the patterning of the material layer 250, wherein, in some illustrative embodiments, low-k dielectric materials of advanced semiconductor devices may be efficiently patterned with increased depth control for respective metal line trenches, wherein the selection of the implant species may allow the use of a wide class of etch control materials.

Figure 3A:
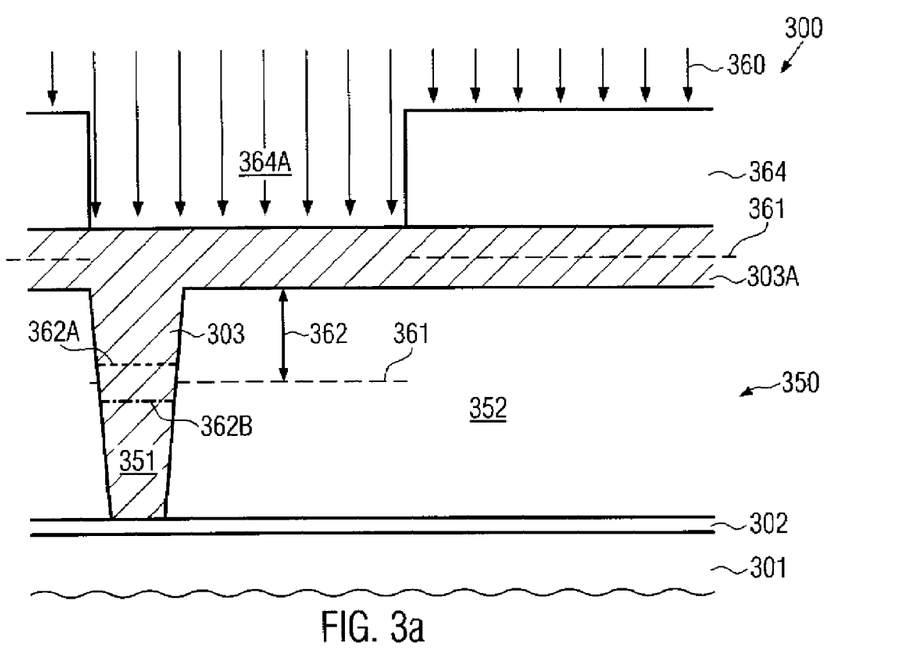
FIGS. 3a-3b schematically illustrate a microstructure device during various manufacturing stages in patterning a dielectric layer according to a dual damascene regime using an implanted etch control material according to other illustrative embodiments disclosed herein.
Figure 3B:
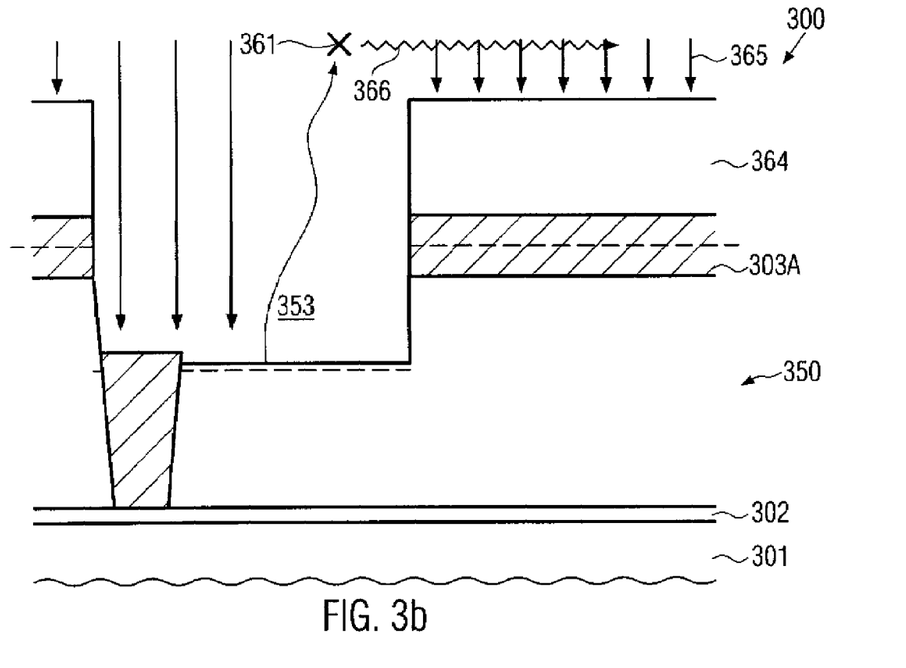

With reference to FIGS. 3a-3b, further illustrative embodiments will now be described in which an appropriate implantation species will be incorporated in a laterally restricted area. FIG. 3a schematically illustrates a microstructure device 300, which may comprise a substrate 301 and a material layer 350 to be patterned in accordance with device requirements. With respect to the microstructure device 300 and the substrate 301, the same criteria apply as previously explained with reference to the devices 100 and 200. In the illustrative embodiments shown, the microstructure device 300 may represent a semiconductor device, wherein in and on the substrate 301 may be provided a plurality of circuit elements, such as transistors, capacitors and the like (not shown). The respective circuit elements may be electrically connected by one or more metallization layers, wherein the material layer 350 may represent one of these metallization layers and may therefore comprise a dielectric material 352, which may include any appropriate material composition to provide the desired characteristics. For instance, the dielectric material 352 may comprise, at least across a significant depth thereof, a low-k dielectric material. Furthermore, the dielectric material 352 may be formed on an etch stop or barrier layer 302, which may be comprised of any appropriate etch stop and barrier material, such as silicon nitride, silicon carbide, nitrogen-enriched silicon carbide and the like. Furthermore, a via opening 351 may be formed through the dielectric material 352 down to the etch stop layer 302, wherein, in this manufacturing stage, the via opening 351 may be filled with an appropriate fill material 303, which, in some embodiments, may also form an appropriate layer 303A that may provide a substantially planar surface topography and may also provide ARC characteristics for forming a mask 364 on the basis of photolithography techniques. For instance, the fill material 303 may be comprised of any appropriate polymer material, resist material and the like.

The microstructure device 300 as shown in FIG. 3a may be formed on the basis of well-established techniques as previously described, wherein the dielectric material 352 of the metallization layer 350 may be formed on the basis of any appropriate deposition technique followed by well-established lithography processes for defining the via opening 351 in the material 352, wherein a corresponding etch process may be reliably stopped on the basis of the etch stop layer 302. It should be appreciated, however, that the via opening 351 may not necessarily be formed in this manufacturing stage and may instead be formed after patterning a respective trench in an upper portion of the material 352 according to a well-established "trench first-via last" approach. Thereafter, the fill material 303 may be provided by any appropriate deposition technique, such as spin-on, CVD and the like, depending on the type of material to be deposited. If required, additional planarization techniques may be used for further enhancing the surface topography and adapting the layer thickness of the material 303A. In a typical trench first-via last approach, the layer 303A may represent any appropriate ARC or hard mask layer required for the subsequent patterning of the material 352. Next, well-established lithography techniques may be used to pattern a resist material in order to form the mask 364. In the embodiment illustrated, the mask 364 may have an opening 364A, which substantially defines the lateral dimensions of a respective trench to be formed in an upper portion of the material 352. In the embodiment shown, the mask 364 may additionally be used as an implantation mask during an implantation process 360 for introducing an appropriate implantation species 361 to a specified depth 362, as is previously described with respect to the implantation process 260. Consequently, in this case, the implantation species 361 is laterally restricted substantially to an area at which a respective trench is to be formed, thereby not substantially affecting the remaining material 352. Consequently, the respective concentration of the implantation species 361 may be selected in view of reliability of controlling a subsequent etch process, while the interaction with the material of the layer 352 may be less critical. For instance, the specified depth 362, that is, the point of the maximum concentration, may not exactly correspond to the target depth of the trench under consideration but may require a minor "over-etch time" upon reaching the maximum concentration, thereby removing the essential amount of the implantation species 361. Hence, any interaction with the material of the layer 352 may further be reduced. Consequently, during the implantation process 360, a high degree of flexibility in selecting the type of implantation species as well as the resulting concentration may be provided.

It should be appreciated that typically the ion blocking characteristics of the mask 364 may substantially prevent the penetration of covered portions of the layer 352. In other illustrative embodiments, the implantation process 360 may be performed at an intermediate stage of the subsequent etch process, i.e., after opening the layer 303A, thereby providing an even increased relative ion blocking behavior of the combined mask 364 and the patterned layer 303A, since the corresponding implantation energy and thus the averaged penetration depth may be selected to be less compared to the implantation through the layer 303A. Consequently, the incorporation of the implant species 361 in lateral portions of the layer 352, which are covered by the mask 364 may be effectively suppressed or at least be significantly reduced. It is to be noted that a different mechanism for stopping implanted ions of the species 361 in the fill material 303 compared to the material 352 may not significantly affect the efficiency of the implantation species 361 provided at the desired depth 361 for acting as an etch control material. For instance, if the fill material 303 may provide an increased stopping efficiency, the respective implantation species 361 may be positioned around a reduced depth 362A, while in the other case when the material 303 may stop the penetrating implantation species 361 less efficiently, an increased depth 362B may result. Since the fraction of implantation species 361 positioned within the via opening 351, i.e., within the fill material 303, is significantly less compared to the species 361 positioned at the desired depth 362, the corresponding maximum concentration may nevertheless be detected with high reliability. In other cases, when the respective via opening 351 has not yet been formed according to the "trench first-via last" approach, a substantially uniform depth 362 may be obtained during the implantation process 360.

FIG. 3b schematically illustrates the microstructure device 300 when subjected to an etch process 365 in order to form a respective opening 353 in the upper portion of the material layer 352. As previously explained, when the etch front of the process 365 approaches the concentration distribution centered around the specified depth 362, increasingly atomic or molecular species 361 may be released into the etch atmosphere and may radiate at a prominent emission wavelength 366, which may be reliably detected, as is previously explained. It should be appreciated that in some illustrative embodiments when implantation-induced damage of the mask 364 caused by the preceding implantation process 360 may not be negligible, an appropriate dose and implantation time may be selected so as to obtain, on the one hand, a desired high concentration of the species 361, while nevertheless maintaining the resulting implantation damage in the etch mask 364 at an appropriate level. In other illustrative embodiments, the layer 303A may be patterned prior to the implantation process 360 and may provide sufficient etch selectivity during the process 365, wherein implantation-induced damage in the patterned layer 303A may be substantially avoided in the process 360, thereby providing a high etch fidelity during the etch process 365, irrespective of the implantation parameters of the process 360.

Consequently, the process strategy described above provides a high degree of flexibility in selecting an appropriate implantation species as well as a concentration thereof, thereby even further enhancing the reliability of the etch control, while any interaction of the implantation species with the base material of the layer 352 may be significantly reduced or be even completely avoided.

Figure 4A:
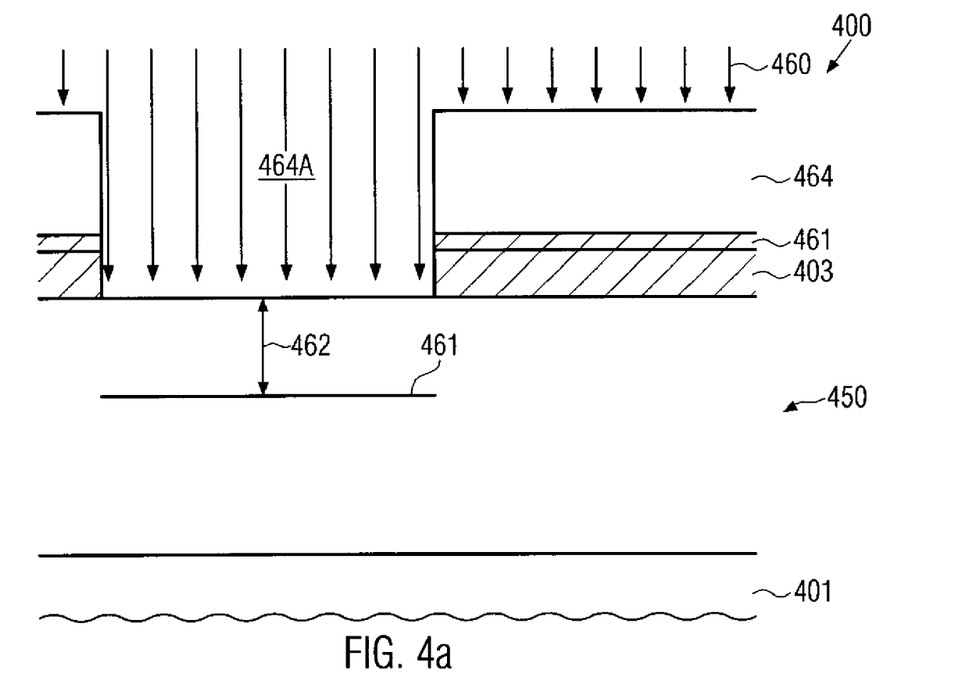
FIGS. 4a-4b schematically illustrate a microstructure device during various manufacturing stages for patterning a material layer on the basis of an etch stop layer formed locally within the material layer according to yet other illustrative embodiments disclosed herein.
Figure 4B:
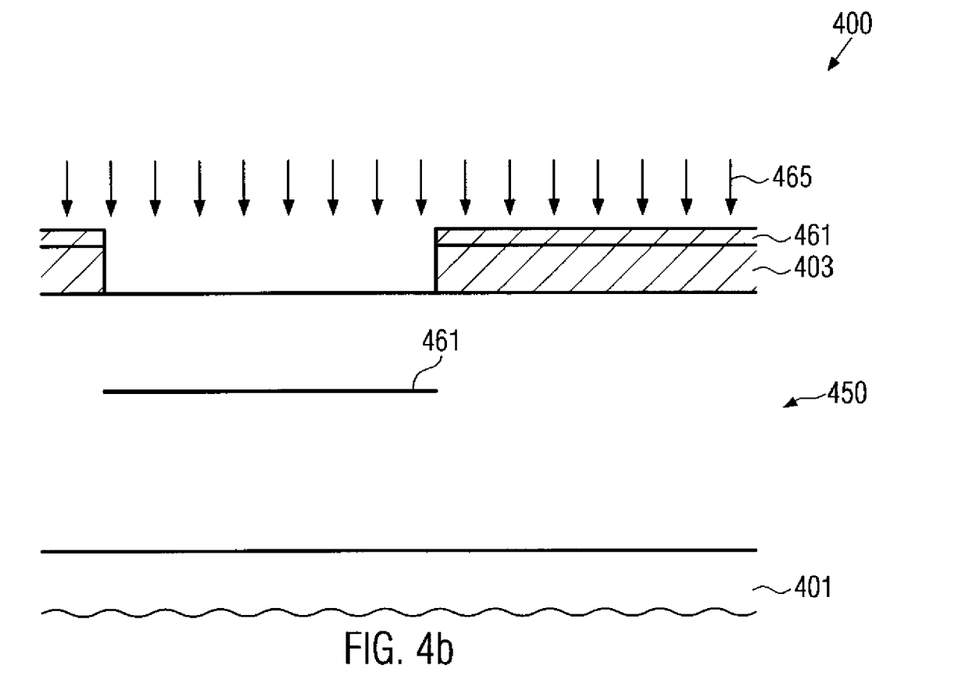

With reference to FIGS. 4a-4b, further illustrative embodiments will now be described in which a moderately high concentration of a respective implantation species is introduced into the material layer to be patterned in a laterally restricted manner, as described above, wherein additionally the moderately high concentration may be used to significantly locally alter the material characteristics to provide a certain degree of etch stop effect.

FIG. 4a schematically illustrates a microstructure device 400 comprising a substrate 401 above which may be formed a material layer 450 that is to be patterned. Moreover, a mask 464 may be formed above the layer 450, wherein, if required, an appropriate ARC material or hard mask material 403 may be provided, which may be used for patterning the layer 450, when implantation-induced damage of the mask 464 may require the removal of the mask 464 prior to the actual patterning process. For instance, the ARC layer or hard mask layer 403 may be comprised of any appropriate material, such as silicon oxynitride, silicon dioxide, silicon nitride, silicon carbide, oxygen-enriched silicon carbide, combinations thereof and the like. With respect to the other components of the device 400, the same criteria apply as previously described with respect to the devices 100, 200 and 300. Hence, a further description of these components as well as a process flow for forming the same will be omitted here.

Furthermore, the device 400 is subjected to an ion implantation process 460 for introducing a species 461 to a desired depth 462, wherein the type and concentration of the respective species 461 may be selected, additionally or alternatively, to provide a distinctive endpoint detection signal, so as to significantly alter the material characteristics of the layer 450 at the desired depth 462. For example, nitrogen, carbon or other components may be introduced with a moderately high concentration so as to significantly affect the etch rate during a subsequent etch process. For instance, a moderately high nitrogen concentration, for instance in a range of $10^{19}$-$10^{22}$ atoms/cm$^3$, may be introduced on the basis of the implantation process 460. Due to the moderately high implantation dose values required for obtaining the concentration, additionally respective high implantation-induced damage may be created in the upper portion of the layer 450 down to the specified depth 462, thereby also affecting the etch rate in a subsequent etch process. Thus, due to the ion bombardment, the etch rate may be increased in the upper portion, while due to the species 461, a significant etch stop effect may be obtained at the desired depth 462. If the implantation-induced damage in the resist mask 464 may also result in a corresponding corrosion of the resist material, in some illustrative embodiments, the resist material 464 may be removed prior to the actual patterning process, which may then be performed on the basis of the mask 403.

FIG. 4b schematically illustrates the device 400 during a patterning process 465, wherein the resist material 464 may have been removed, as previously explained. In other illustrative embodiments, the process 465 may also be performed on the basis of the resist mask 464. Consequently, when the etch front approaches the specified depth 462, the etch rate may become increasingly lower, thereby equalizing the etch rate across the entire substrate 401. Moreover, the species 461 may be increasingly released into the etch atmosphere and may be detected on the basis of optical endpoint systems, as previously explained. It should be appreciated that, in some illustrative embodiments, an additional "indicator" material may be introduced, for example, in a moderately low concentration in view of cycle time, in a further implantation process, when the "etch stop" species may not provide a desired distinctive emission radiation during the etch process. Consequently, due to the significantly reduced etch rate at the specified depth 462, the substrate-to-substrate uniformity may be significantly increased, as is the case in the previous embodiments, while additionally an enhanced across-substrate uniformity may be achieved due to the etch stop effect of the implanted species 461. Furthermore, due to the lateral restriction of the implantation species 461, the overall material characteristics of the layer 450 may not be substantially affected.

Figure 5A:
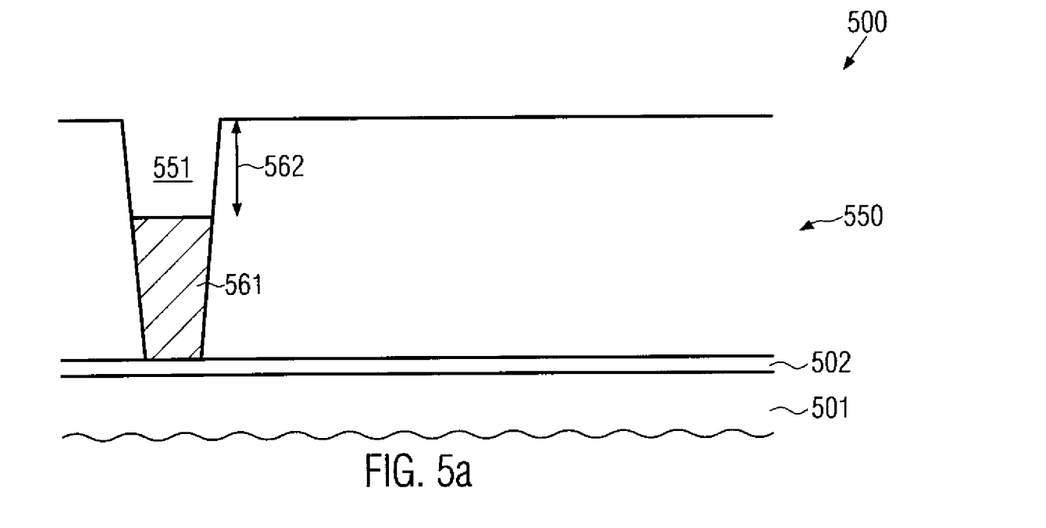
FIGS. 5a-5c schematically illustrate cross-sectional views of a semiconductor device during patterning of a dielectric layer of a metallization level according to a dual damascene regime by incorporating an etch control material into respective via openings prior to patterning respective trenches according to yet other illustrative embodiments disclosed herein.
Figure 5B:
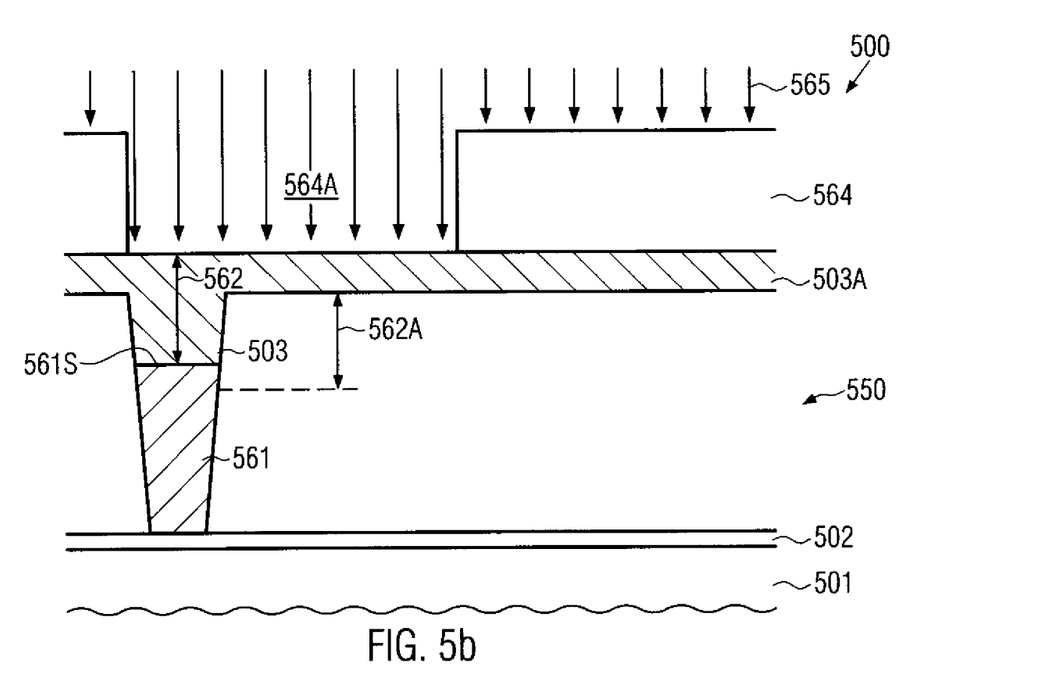

With reference to FIGS. 5a-5b, further illustrative embodiments will now be described, wherein an etch stop material or "indicator" material may be provided in a via opening prior to patterning a trench, wherein the indicator material may provide an efficient endpoint detection signal.

FIG. 5a schematically illustrates a microstructure device 500 comprising a substrate 501, above which is formed a material layer 550 to be patterned so as to receive a via opening and a trench opening according to a typical "via first-trench last" approach in the dual damascene regime. Furthermore, an etch stop layer 502 may be provided between the substrate 501 and the layer 550. With respect to these components, the same criteria apply as previously explained. Furthermore, in this manufacturing stage, the layer 550 may comprise a via opening 551, which may have formed therein an indicator or etch control material 561 filled up to a height so as to specify a depth 562. The material 561 may represent any appropriate material that may be deposited in an appropriate manner so as to allow the partial filling of the via opening 551 as shown. Moreover, the material 561 may comprise a specified component or species, such as a metal and the like, which may allow reliable detection during a subsequent process when released into the etch ambient. In other cases, the material 561 may lack a corresponding component and this component may be added to a further material to be formed above the material 561, as is described with reference to FIG. 5b.

The material 561 may be provided on the basis of any appropriate deposition technique, such as a spin-on process, wherein a defined amount of material may be deposited and may be distributed across the substrate 501, wherein, due to the low viscosity state, reliable filling of the via opening 551 may be accomplished. In some cases, additional treatments may be performed, for instance heating the substrate 501, so as to ensure reliable filling of the lower part of the via opening 551. Thereafter, the material 561 may be cured and a surface cleaning process may be performed in order to remove residues of the material 561 from exposed surface portions of the layer 550. Thereafter, a further fill material may be provided, which may be complementary to the material 561 with respect to a corresponding etch control material, as is previously explained. That is, if the material 561 comprises a respective component emitting a distinctive emission wavelength, the subsequent fill material may be substantially devoid of any such material, and vice versa.

FIG. 5b schematically illustrates the device 500 in a further advanced manufacturing stage. A second fill material 503 may be formed in an upper portion of the via opening 551 and may also define a respective layer 503A for providing a substantially planar surface topography. As previously explained, the material 503 may additionally provide the desired ARC effect. Moreover, a resist mask 564 may be formed above the layer 503A and may have formed therein a respective opening 564A, which substantially defines the lateral dimensions of a trench to be formed in an upper portion of the layer 550. The material 503 and the layer 503A may be formed on the basis of well-established techniques, such as deposition by spin-coating and the like, as is well known in the art. Furthermore, the resist mask 564 may be manufactured on the basis of well-established photolithography techniques. Moreover, the device 500 may be subjected to an anisotropic etch process 565, wherein well-established etch recipes may be used. During the advance of the respective etch front, an interface 561S between the material 503 and 561 may result in a corresponding change of the composition of the gaseous ambient due to an increased release of an indicator material or due to an abrupt stop of release of an indicator material, depending on whether the respective material is provided in the material 503 or 561. It should be appreciated that the effective area of the interface 561S is relatively small compared to the entire area to be etched during the process 561, i.e., the corresponding trench bottom area is significantly larger than any vias formed in the respective trench, which may, however, nevertheless provide a reliable endpoint detection signal, since any appropriate exotic component may be provided with a sufficiently high concentration.

Since the etch rate in the material 503 may not necessarily be the same as the etch rate in the material of the layer 550, the corresponding specified depth 562 may be selected such that a corresponding correlation between the different etch rates may be taken into consideration. For instance, if the etch rate in the material 503 is higher compared to the etch rate in the layer 550, the respective depth 562 may be selected greater than a target depth of the corresponding trench to be etched in the upper portion of the material 550. Similarly, when the etch rate is lower, the corresponding specified depth 562 may be selected smaller compared to the actual target depth of the trench to be formed. This latter case is schematically illustrated in FIG. 5b, wherein the specified depth 562 is less than the target depth 562A required in the material of the layer 550.

Figure 5C:
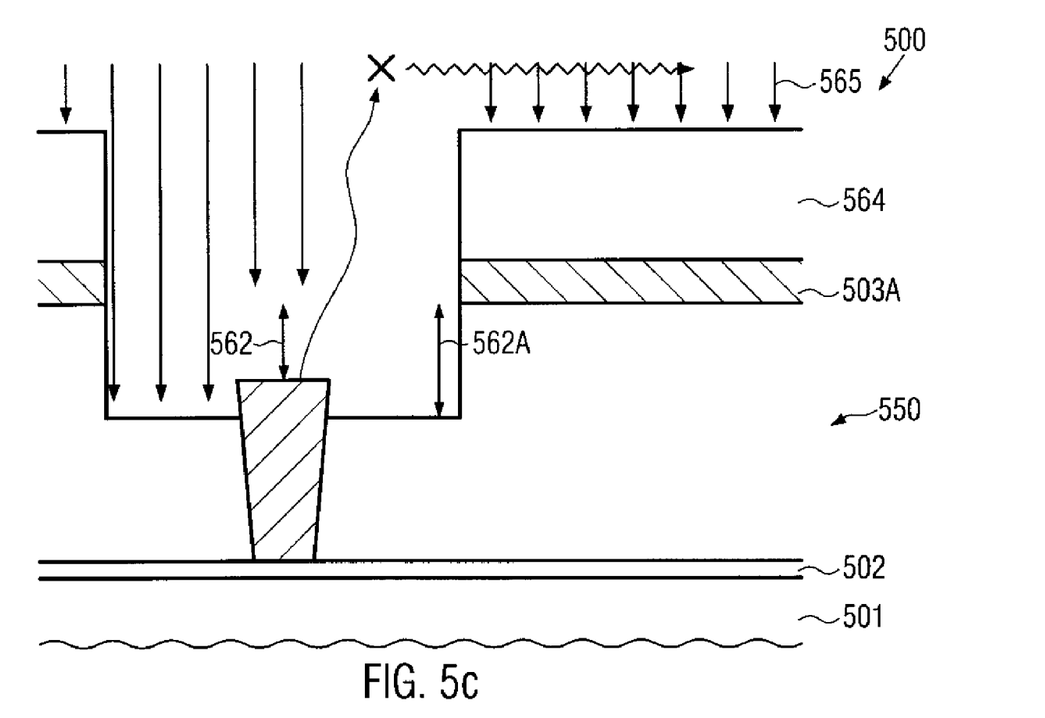

FIG. 5c schematically illustrates the device 500 in a further advanced manufacturing stage. Here, the etch front within the material 561 may have reached the interface 561S, thereby releasing the corresponding species into the etch ambient or stopping a release of etch control material when provided in the material 503, which may be reliably detected, even though the overall area of the interface 561S may represent only a small fraction of the total etched area. For the example described above, i.e., a higher etch rate of the material 550, the etch front may have reached the desired target depth 562A in the layer 550 when the interface 561S is reached. It should be appreciated that a corresponding correlation between the respective etch rates in the materials 503 and 550 may be readily established in advance on the basis of respective test runs and like.

Consequently, a high degree of etch controllability may be accomplished while at the same time a high degree of compatibility with conventional via first-trench last approaches may be achieved. Moreover, any negative interaction of the etch control material with the layer 550 may be avoided or at least be significantly suppressed.

Figure 6A:
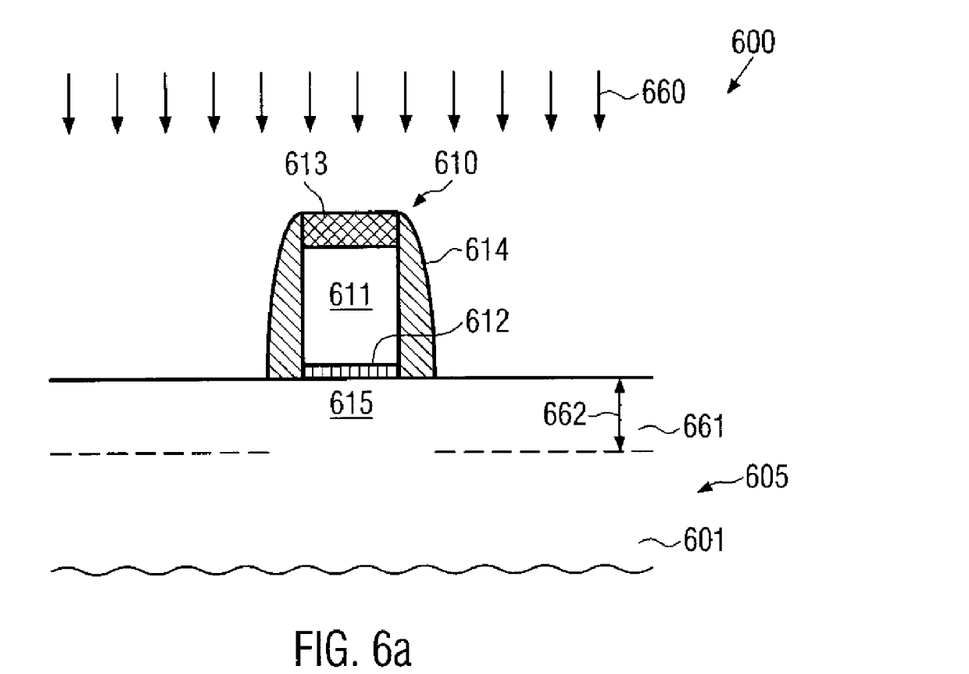
FIGS. 6a-6b schematically illustrate cross-sectional views of a semiconductor device during the patterning of a semiconductor layer to receive respective recesses adjacent to a gate electrode for forming therein a strained semiconductor material according to further illustrative embodiments disclosed herein.
Figure 6B:
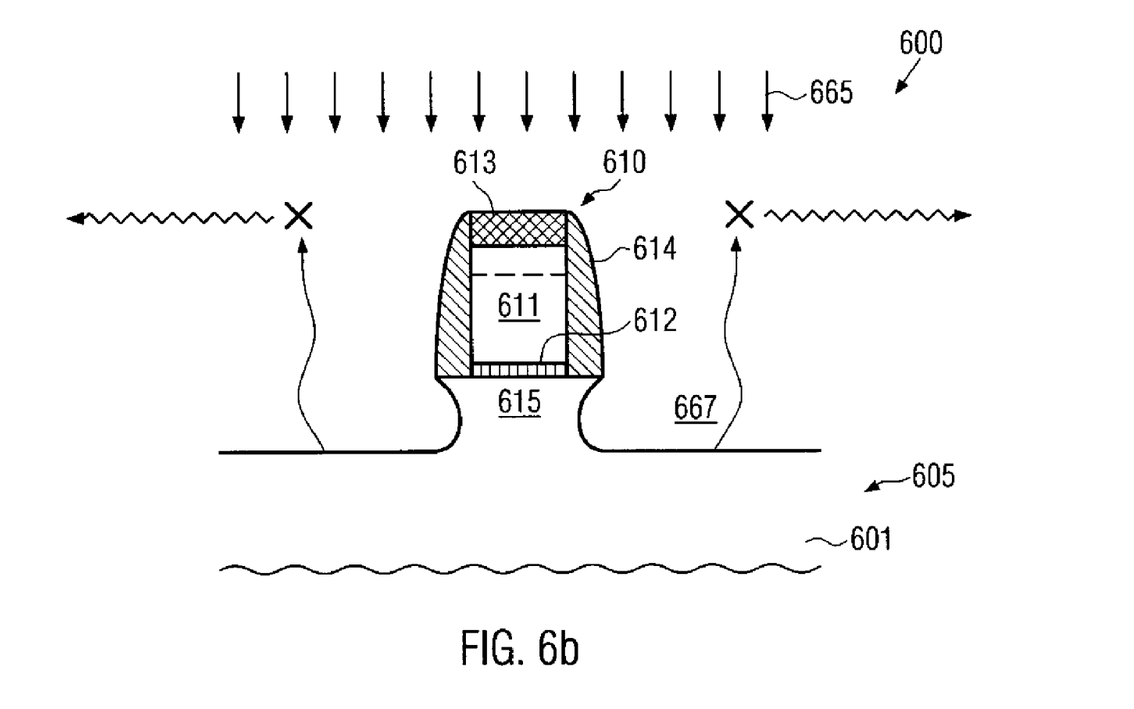

With reference to FIGS. 6a-6b, further illustrative embodiments will now be described in which an enhanced etch control for an etch process for recessing a semiconductor region may be accomplished. A semiconductor device 600 may comprise a substrate 601, above which may be formed a semiconductor layer 605, which may, for instance, represent a silicon-based material. Furthermore, a circuit feature, such as a field effect transistor 610, may be provided above the semiconductor layer 605 in an early manufacturing stage. In this phase, the circuit element 610 may comprise a gate electrode 611 formed above the semiconductor layer 605 and separated therefrom by a gate insulation layer 612. Furthermore, the gate electrode 611 may be encapsulated by a capping layer 613 and a respective sidewall spacer 614. For instance, the spacer 614 and the capping layer 613 may be comprised of any appropriate dielectric material, such as silicon nitride, silicon dioxide and the like, which may act as an efficient etch and epitaxial growth mask during the subsequent processing of the device 600. As is well known, strain in a channel region 615 of the field effect transistor 610 may efficiently modify the charge carrier mobility, which provides an efficient means for increasing the overall performance of field effect transistors. In some approaches, therefore, a strained semiconductor material is formed adjacent to the channel region 615 by forming a respective recess and epitaxially growing therein a strained semiconductor material, such as silicon/germanium, silicon/carbon and the like, depending on the type of strain required in the channel region 615. During the respective etch process for forming the recess, an increased controllability may therefore significantly enhance the overall process uniformity and thus the uniformity of the respective performance gain of the device 610. Consequently, according to the subject matter disclosed herein, an implantation process 660 may be performed to incorporate a specified implantation species 661 at a specified depth 662. With respect to the characteristics of the implantation process 660, the same criteria apply as previously explained.

FIG. 6b schematically illustrates the device 600 in a further advanced manufacturing stage, wherein the device 600 is exposed to an etch process 665 for forming respective cavities 667 adjacent to the channel region 615. During the etch process 665, the etch front moves towards the etch control material 661, components of which may be released into the etch atmosphere and may be detected by a corresponding optical endpoint detection system, as previously explained. Consequently, substrate-to-substrate uniformity may be efficiently increased, as is previously described.

In other illustrative embodiments, the implantation species 661 may be selected such that the etch behavior of the semiconductor layer 605 may be significantly changed locally in order to provide a certain degree of etch stop behavior. For instance, during the implantation process 660, oxygen may be incorporated into the semiconductor layer 605 when comprising, for instance, a significant amount of silicon. Thereafter, a heat treatment may be performed so as to locally form silicon dioxide at the specified depth 662, which may act as an efficient etch indicator and/or etch stop layer during the process 665. Consequently, even an increased across-substrate uniformity of the etch process 665 may be obtained due to the etch stop characteristics of the species 661. It should be appreciated that respective implantation processes for introducing a high concentration of oxygen are well established in the art and may be used for the process 660.

As a result, the subject matter disclosed herein enables the incorporation of an etch control material into material layers to be patterned after the formation of the layer, wherein an interaction of the etch control material with the material layer may be maintained at a low level, or may be substantially avoided, while nevertheless providing a pronounced endpoint detection signal. In some illustrative embodiments, the respective etch control material may be incorporated in a laterally restricted manner, thereby even further reducing any interaction with the remaining material. In illustrative embodiments, the etch control material may be incorporated by ion implantation, thereby providing a high degree of process uniformity and flexibility of selecting the etch control material, since a wide class of materials may be processed in presently available implant tools, thereby allowing the selection of even very "exotic" candidates.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    implanting a specified etch control material into a material layer of a microstructure device to specify a target depth in said material layer;
    forming an etch mask above said material layer after implanting said specified etch control material;
    patterning said material layer on the basis of said etch mask by performing an etch process; and
    controlling said etch process on the basis of detecting said implanted etch control material released during said etch process.

2. The method of claim 1, wherein said material layer represents a low-k dielectric layer of a metallization layer of said microstructure device.

3. The method of claim 2, wherein patterning said material layer comprises forming a trench in an upper portion of said low-k dielectric layer.

4. The method of claim 1, wherein controlling said etch process comprises detecting a release of at least one component of said etch control material by optical spectral analysis.

5. The method of claim 1, wherein implanting said specified etch control material comprises positioning a concentration maximum of said etch control material at said target depth.

6. The method of claim 1, wherein said specified etch control material changes an etch rate of said material layer, said change in said etch rate providing an etch stop effect during said etch process.

7. The method of claim 1, wherein said material layer represents a semiconductor material receiving a trench for forming a strained semiconductor material in said trench.

8. A method, comprising:
    forming a material layer above a substrate of a microstructure device;
    forming an etch control material within a laterally restricted area of said material layer to specify a predetermined target depth in said material layer; and
    performing an etch process for patterning said material layer while using said etch control material for controlling said etch process by detecting said etch control material released during said etch process.

9. The method of claim 8, wherein forming said etch control material comprises forming a mask to define said laterally restricted area.

10. The method of claim 9, wherein said etch control material is formed by implanting an implantation species.

11. The method of claim 10, wherein said implantation species is selected to provide a distinctive signal in an optical spectral analysis technique.

12. The method of claim 10, wherein said implantation species changes an etch rate of said material layer, said change in said etch rate providing an etch stop effect during said etch process.

13. The method of claim 9, further comprising using said mask to form a first opening and introducing said etch control material into said first opening to control said etch process for forming a second opening enclosing said first opening.

14. The method of claim 13, wherein introducing said etch control material comprises partially filling said first opening with a first fill material and filling a remaining portion of said first opening with a second fill material, said first and second fill materials having a different material composition.

15. A method, comprising:
    providing a substrate having formed thereon a dielectric layer of a microstructure device; and
    forming an etch control material within said dielectric layer, said etch control material positioned to specify a target depth for patterning said dielectric layer.

16. The method of claim 15, further comprising etching said dielectric layer and using an endpoint signal obtained on the basis of said etch control material for controlling an etch depth according to said predetermined target depth.

17. The method of claim 15, wherein said etch control material is formed within said dielectric layer by ion implantation.

18. A method, comprising:
    implanting a specified etch control material into a material layer of a microstructure device, wherein said specified etch control material provides a change in an etch rate of said material layer, said change in said etch rate providing an etch stop effect during an etch process;
    patterning said material layer by performing an etch process; and
    controlling an etch depth of said etch process on the basis of said change in said etch rate of said material layer during said etch process.

19. The method of claim 18, further comprising additionally controlling said etch process on the basis of detecting said implanted etch control material released during said etch process.

20. The method of claim 19, wherein additionally controlling said etch process comprises detecting a release of at least one component of said etch control material by optical spectral analysis.

21. The method of claim 18, wherein implanting said specified etch control material comprises positioning a concentration maximum of said etch control material at a target depth in said material layer.

22. The method of claim 18, further comprising forming an etch mask above said material layer and patterning said material layer on the basis of said etch mask.

23. The method of claim 22, wherein said specified etch control material is implanted after forming said etch mask, said etch mask acting as an implantation mask.

* * * * *